(12) United States Patent
Esmark et al.

(10) Patent No.: US 7,279,726 B2
(45) Date of Patent: Oct. 9, 2007

(54) ESD PROTECTION DEVICE

(75) Inventors: Kai Esmark, Neuried (DE); Ulrich Glaser, München (DE); Martin Streibl, Petershausen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/411,403

(22) Filed: Apr. 26, 2006

(65) Prior Publication Data

US 2006/0238937 A1 Oct. 26, 2006

(30) Foreign Application Priority Data

Apr. 26, 2005  (DE)  ............ 10 2005 019 305

(51) Int. Cl.
  *H01L 29/00* (2006.01)
  *H02H 3/22* (2006.01)
(52) U.S. Cl. ............ 257/107; 257/109; 257/E27.011; 361/111
(58) Field of Classification Search ........... 257/107, 257/109; 361/111
See application file for complete search history.

(56) References Cited

U.S. PATENT DOCUMENTS

| | | | |
|---|---|---|---|
| 3,943,427 A | 3/1976 | Tolstov et al. | |
| 5,124,877 A | 6/1992 | Graham | |
| 5,150,187 A | 9/1992 | Huang | |
| 5,290,724 A | 3/1994 | Leach | |
| 5,602,404 A | 2/1997 | Chen et al. | |
| 5,747,837 A | 5/1998 | Iwase et al. | |
| 5,821,572 A | 10/1998 | Walker et al. | |

FOREIGN PATENT DOCUMENTS

| | | |
|---|---|---|
| EP | 0 296 675 | 12/1988 |
| EP | 0 753 892 | 1/1997 |
| EP | 1 058 308 A1 | 12/2000 |
| EP | 1 496 591 A1 | 1/2005 |
| WO | WO96 21247 | 7/1996 |

OTHER PUBLICATIONS

Electrostatic Discharge Protection for Mixed Voltage Interface, IBM Technical Disclosure Bulletin, Vo. 34, No. 4A, Sep. 1991, pp. 222-223.

*Primary Examiner*—Evan Pert
(74) *Attorney, Agent, or Firm*—Brinks Hofer Gilson & Lione

(57) ABSTRACT

An ESD protection device for protecting a circuit against electrostatic discharges. The ESD protection device having a series circuit of N diodes, each diode comprising an anode and a cathode. The series circuit being connected between two supply potentials. The diodes being so arranged that a spatial distance between the anode of a first diode and the cathode of an Nth diode of the series circuit is less than a maximum distance between the anode or cathode of a first spatially outer diode of the series circuit and the anode or cathode of a second spatially outer diode of the series circuit.

20 Claims, 3 Drawing Sheets

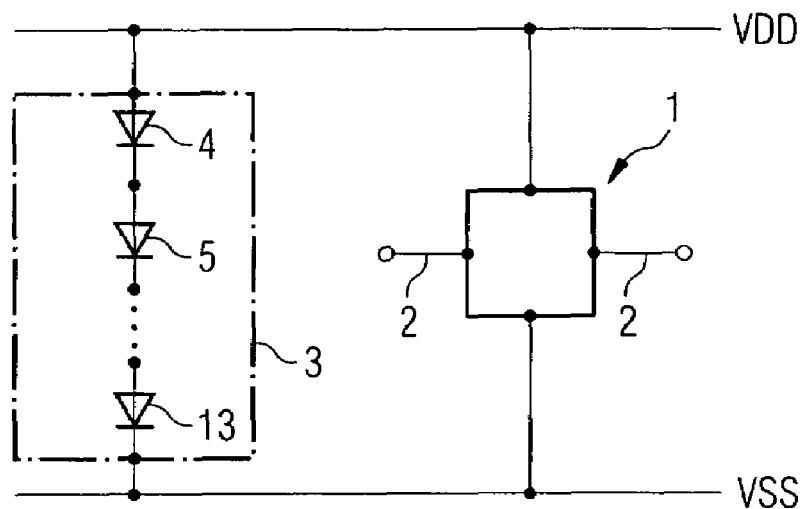
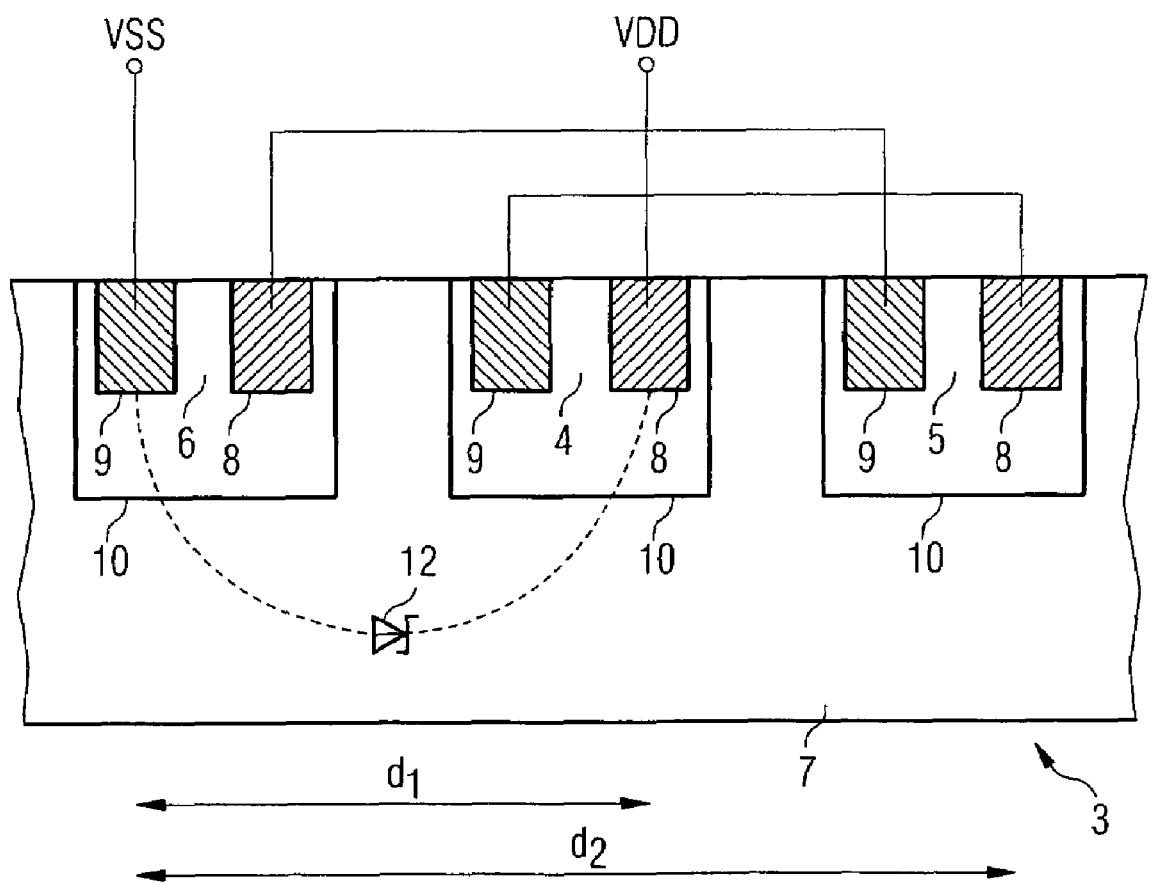

ESD PROTECTION DEVICE

PRIORITY CLAIM

This application claims priority to Germany Patent Application No. DE 10 2005 019305.6 filed Apr. 26, 2005.

BACKGROUND OF THE INVENTION

The present invention relates to an ESD protection device for protecting a circuit against electrostatic discharges (ESD) and, in particular, to an ESD protection device having a diode series circuit.

Electrostatic discharges may occur as the result of the transfer of electrical charge between a circuit and a human operator or a metallic surface, and may result in high voltages between two supply potentials of the circuit or in high currents through the circuit, which may damage or destroy the circuit. The "charged device" model (CDM) describes situations in which the circuit is charged and discharges if, for example during installation, it comes into contact with a conductive metal part. In the CDM, such discharge events are characterized by the flow of high discharge currents occurring over short time-scales, of the order of magnitude of one nanosecond. Owing to their small size, integrated semiconductor circuits are particularly sensitive to high voltages between two supply potentials of the circuit or to high discharge currents through the circuit.

To a certain extent, circuits can be protected against electrostatic discharges in that the occurrence of the latter is prevented by careful handling of the circuit during installation and operation. In addition, circuits, particularly integrated semiconductor circuits, are frequently equipped with ESD protection devices which, upon the occurrence of an electrostatic discharge, offer a low-resistance discharge path and divert the charge to one of the supply-voltage lines such that no overvoltage occurs that could damage a circuit to be protected, or such that a high discharge current does not flow through the circuit to be protected.

ESD protection devices may comprise diodes, bipolar transistors, metal-oxide transistors, thyristors or similar elements, as well as combinations of the aforementioned elements, which have a non-linear current-voltage characteristic. ESD protection devices are frequently of such design that they are high-resistance for voltages that are less than or equal to an operating voltage of the circuit to be protected while, for voltages that are significantly greater than the operating voltage of the circuit to be protected and that might damage the circuit to be protected, they enter a low-resistance state to provide a discharge path for the electrostatic discharge, said discharge path being in parallel to the circuit to be protected. In order for the circuit to be protected in an effective manner against transient discharges, particularly in the CDM, the transition from the high-resistance state to the low-resistance state of the ESD protection device should be effected over as short a time scale as possible, comparable to the characteristic time scale of the electrostatic discharge.

A conventional ESD protection device comprises a series circuit of diodes which is to be so arranged as a voltage clamp between a first supply potential, e.g. VDD, and a second supply potential, e.g. VSS, that it is connected in parallel to the circuit to be protected. However, the time required to discharge electrostatic transients using a series circuit of diodes can often be inadequate to protect the circuit. Further, the clamping characteristics of such a circuit may also be inadequate for certain implementations.

Therefore, there is a need for an ESD protection device, in which the time required from the transition from a high-resistance to a low-resistance state is reduced in comparison with the conventional ESD protection device having a diode series circuit. Furthermore, there is a need for an ESD protection device which, compared with the conventional ESD protection device having a diode series circuit, has comparable or improved clamping characteristics in combination with an improved time characteristics.

BRIEF SUMMARY OF THE INVENTION

According to one embodiment of an ESD protection device, a series circuit has N number of diodes in electrical series connection where $N \geqq 2$ diodes. The series circuit is to be connected as a voltage clamp between a first supply potential and a second supply potential. The diodes are arranged such that a spatial distance between an anode of a first diode of the series circuit and a cathode of an Nth diode (last diode) of the series circuit is less than a maximum distance between the anode or cathode of a first spatially outer diode of the series circuit and the anode or cathode of a second spatially outer diode of the series circuit. In comparison with a conventional ESD protection device having a diode series circuit, the spatial distance between the anode of the first diode of the series circuit and the cathode of the Nth diode of the series circuit is thereby reduced, resulting in a reduction of the time required for the diffusion of charge carriers from the anode of the first diode of the series circuit to the cathode of the Nth diode of the series circuit, which time defines a time scale for the transition of the ESD protection device from a high-resistance state to a low-resistance state. An additional advantage is that, owing to the arrangement of the diodes, the voltage at which the ESD protection device enters a low voltage state is further reduced in comparison with the conventional arrangement.

The diodes of the series circuit are preferably formed on a semiconductor substrate of a first conduction type. More preferably, there are provided, for each of the N diodes of the series circuit, an anode zone of the first conduction type and a cathode zone of a second conduction type, opposite to the first conduction type, in a well of the second conduction type, the wells of the second conduction type being laterally arranged in the semiconductor substrate of the first conduction type. The first conduction type is preferably p-doped. More preferably, the anode zones and the cathode zones of the N diodes of the series circuit are highly doped. Such a design of the diode series circuit is advantageous in respect of the integration of the ESD protection device into an integrated semiconductor circuit.

The first and the Nth diode of the series circuit are preferably arranged adjacently, in order that the spatial distance between the anode of the first diode of the series circuit and the cathode of the Nth diode of the series circuit is small, and the time scale for the transition of the ESD protection device from a high-resistance state to a low-resistance state is thus short.

In a further embodiment, the anodes and the cathodes of the first diode of the series circuit and of the Nth diode of the series circuit are arranged in such a way that the spatial distance between the anode of the first diode of the series circuit and the cathode of the Nth diode of the series circuit is less than a spatial distance between the cathode of the first diode of the series circuit and the anode of the Nth diode of the series circuit. The distance between the anode of the first diode of the series circuit and the cathode of the Nth diode of the series circuit is thereby further reduced, e.g. in comparison with the conventional ESD protection device, and the time scale for the transition of the ESD protection device from a high-resistance state to a low-resistance state is thus shortened.

According to an embodiment, the spatial arrangement of the diodes of the series circuit is preferably realized as a one-dimensional or a two-dimensional arrangement of the diodes. In a one-dimensional spatial arrangement, the diodes of the series circuit are arranged in succession along a predefined line. In a two-dimensional spatial arrangement, the diodes are arranged in a predefined plane. Whereas the one-dimensional spatial arrangement has the advantage of being easily realized, the two-dimensional spatial arrangement enables a large number of diodes to be accommodated on a surface of small spatial dimensions.

A further aspect of the various embodiments of the ESD protection device is that they may be integrated into integrated semiconductor circuits. The ESD protection device will therefore preferably be used for protecting semiconductor circuits against electrostatic discharges. More preferably, the ESD protection device is designed with the semiconductor circuit in the form of an integrated semiconductor circuit. However, the use of the ESD protection device is not limited to such circuits.

BRIEF DESCRIPTION OF THE DRAWINGS

Preferred exemplary embodiments of the invention will be explained more fully in the following with reference to the drawing.

FIG. 1 shows, in schematic form, a circuit arrangement having an ESD protection device having a diode series circuit;

FIG. 2 shows a first exemplary embodiment of an ESD protection device having a diode series circuit;

DETAILED DESCRIPTION OF THE INVENTION

Figure 3:
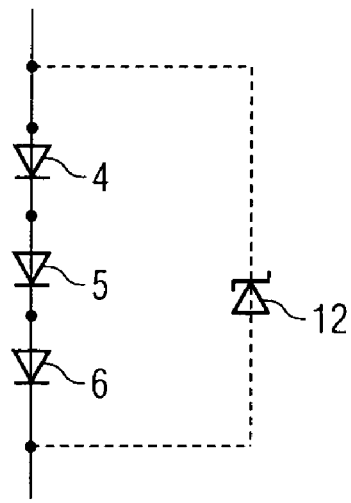
FIG. 3 shows an equivalent circuit diagram for the ESD protection device, having a diode series circuit, of FIG. 2, 4 or 5.

FIG. 1 shows, in schematic form, a circuit arrangement having a circuit 1 to be protected, which circuit is connected to a first supply potential VDD and to a second supply potential VSS and may have further connections 2. Connected in parallel to the circuit 1 to be protected is an ESD protection device 3, which comprises a series circuit of $N \geq 2$ diodes, each diode having an anode and a cathode, the anode of a first diode 4 being connected to the first supply potential VDD, the cathode of an Nth diode 13 being connected to the second supply potential VSS and, for $1 \leq i < N$, the cathode of an i-th diode being connected to the anode of an i+1-th diode.

Figure 5:
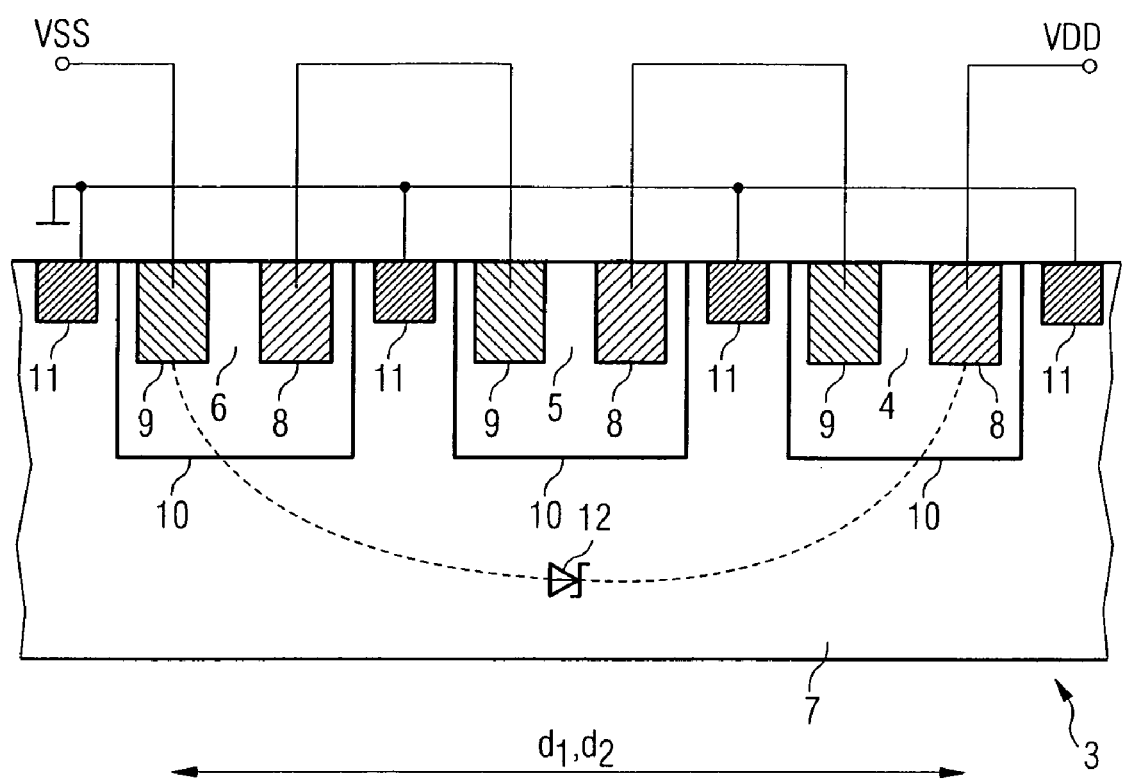
FIG. 5 shows one possible construction of an ESD protection device, having a diode series circuit.

For purposes of comparison, FIG. 5 shows one possible construction for an ESD protection device 3 having a diode series circuit consisting of N=3 diodes 4-6, each having an anode and a cathode. The anode and cathode are formed in that, respectively, a p$^+$-doped anode zone 8 and an n$^+$-doped cathode zone 9 are provided in an n-doped well 10. The n-doped wells 10 are arranged laterally in a p-doped semiconductor substrate 7 and separated from each other by zones of the p-doped semiconductor substrate 7 and p$^+$-doped protective rings 11 embedded therein. If the voltage between the first supply potential VDD and the second supply potential VSS exceeds a value that is dependent on the specific design of the ESD protection device 3, the ESD protection device 3 enters a low-resistance state and provides a discharge path for the electrostatic discharge. In the example represented in FIG. 5, a characteristic threshold voltage for an Si-based semiconductor structure is 1.8 V.

In addition, as soon as the diode series circuit enters the low-resistance state, a parasitic current flows from the anode 8 of the first diode 4 of the series circuit, through the p-doped semiconductor substrate 7, to the cathode 9 of the third diode 6 of the series circuit (indicated schematically by the broken line in FIG. 5). The discharge path 12, corresponding to this parasitic current, through the p-doped semiconductor substrate 7 has a current-voltage characteristic similar to that of a thyristor, and operates in parallel to the diode series circuit. This intrinsic parasitic thyristor 12 improves the characteristic of the ESD protection device 3 such that it further reduces the voltage at which the ESD protection device 3 enters the low-resistance state. The electrical current through the ESD protection device 3 is carried by charge carrier diffusion between the anodes 8 and the cathodes 9 of the diodes 4-6. A characteristic time period in which the ESD protection device 3 changes from the high-resistance state to the low-resistance state is therefore determined by the diffusion time of the charge carriers from the anodes 8 to the cathodes 9 of the diodes 4-6. In the conventional ESD protection device having a diode series circuit, a spatial distance $d_1$ between the anode 8 of the first diode 4 of the series circuit and the cathode 9 of the Nth diode 6 of the series circuit is equal to a maximum distance $d_2$ between the anode 8 or cathode 9 of a first spatially outer diode of the series circuit and the anode 8 or cathode 9 of a second spatially outer diode of the series circuit. A disadvantage of conventional ESD protection devices having a diode series circuit is that, owing to the large spatial distance $d_1$ between the anode 8 of the first diode 4 of the series circuit and the cathode 9 of the Nth diode 6 of the series circuit, a characteristic time scale for the triggering of the parasitic intrinsic thyristor 12 is so long that the circuit 1 to be protected can only be protected in an unsatisfactory manner against transient electrostatic discharges, such as those occurring in the CDM, by the ESD protection device 3 having a diode series circuit.

FIG. 2 shows, in schematic form, a first exemplary embodiment of the ESD protection device 3, according to the invention, having a diode series circuit, for an ESD protection device 3 comprising N=3 diodes, the diodes 4-6 being arranged on a p-doped semiconductor substrate 7. For each of the diodes 4-6 of the series circuit, the anode is formed in that a p$^+$-doped anode zone 8 is provided in an n-doped well 10, and the cathode is realized in that an n$^+$-doped cathode zone 9 is provided in the n-doped well 10, the anode zone 8 and the cathode zone 9 being in each case separated by a zone of the n-doped well 10. The n-doped wells 10 are arranged laterally in the semiconductor substrate 7 and separated by zones of the semiconductor substrate 7.

The ESD protection device 3 according to the embodiment has some similar features to conventional ESD protection devices, although the exemplary embodiment represented in FIG. 2 does not have p$^+$-doped protective rings 11. In contrast to a conventional ESD protection device, however, in the case of the ESD protection device 3 according to the embodiment a first 4, a second 5 and a third diode 6 of the series circuit are so arranged on the semiconductor substrate 7 that the first diode 4 of the series circuit and the third diode 6 of the series circuit are arranged adjacently on the semiconductor substrate 7, whilst the second diode 5 is a spatially outer diode of the series circuit. For this arrangement of the diodes, a spatial distance $d_1$ between the anode 8 of the first diode 4 of the series circuit and the cathode 9 of the third diode 6 of the series circuit is shorter than a spatial distance between the anode 8 of the second diode 5 of the series circuit and the cathode 9 of the third diode 6 of the series circuit, which spatial distance defines a maximum distance $d_2$ between the anode 8 or cathode 9 of a first spatially outer diode of the series circuit and the anode 8 or cathode 9 of a second spatially outer diode of the series circuit. The spatial arrangement of the diodes according to FIG. 2 is such that the spatial distance $d_1$ between the anode 8 of the first diode 4 of the series circuit and the cathode 9 of the third diode 6 of the series circuit in the ESD protection device 3 according to the invention is shorter than in the conventional ESD protection device.

It should be noted that the anodes and cathodes are typically extended regions. The distance between any pair of anodes or cathodes may, for example, encompass the distance between the centers of the corresponding anode or cathode regions, or a distance of the locations at which the respective anodes or cathodes are wired.

As explained above, when the ESD protection device 3 enters a low-resistance state, a parasitic discharge path 12 builds up, in which current flows from the anode 8 of the first diode 4 of the series circuit, through the semiconductor substrate 7, to the cathode 9 of the third diode 6 of the series circuit. The time required for the build-up of this parasitic discharge path 12, which has a current-voltage characteristic similar to that of a thyristor, said time increasing with the spatial distance $d_1$ between the anode 8 of the first diode 4 of the series circuit and the cathode 9 of the third diode 6 of the series circuit, is thus shorter in the ESD protection device 3 according to the embodiment than in the conventional ESD protection device. The more rapid build-up of the parasitic discharge path 12 has the effect that the ESD protection device 3 according to the embodiment performs better than a conventional ESD protection device in protecting the circuit 1 to be protected against transient discharges. In addition, both Technology Computer Aided Design (TCAD) simulations and measurements show that the current-voltage characteristic of the ESD protection device 3 according to the embodiment differs from that of the conventional ESD protection device in that the clamping behaviour is further improved, i.e. that the voltage at which the ESD protection device enters a low-resistance state is less, for the ESD protection device according to the invention, than for the conventional ESD protection device.

It should be noted that, according to the embodiment, the parasitic thyristor 12 builds up in such a way that the current flow in the parasitic thyristor 12 and the diode series circuit is in the same direction.

FIG. 3 shows a circuit diagram of an equivalent circuit for the ESD protection device 3 having a diode series circuit, the parasitic discharge path 12 being schematically represented as a thyristor according to its current-voltage characteristic.

Figure 4:
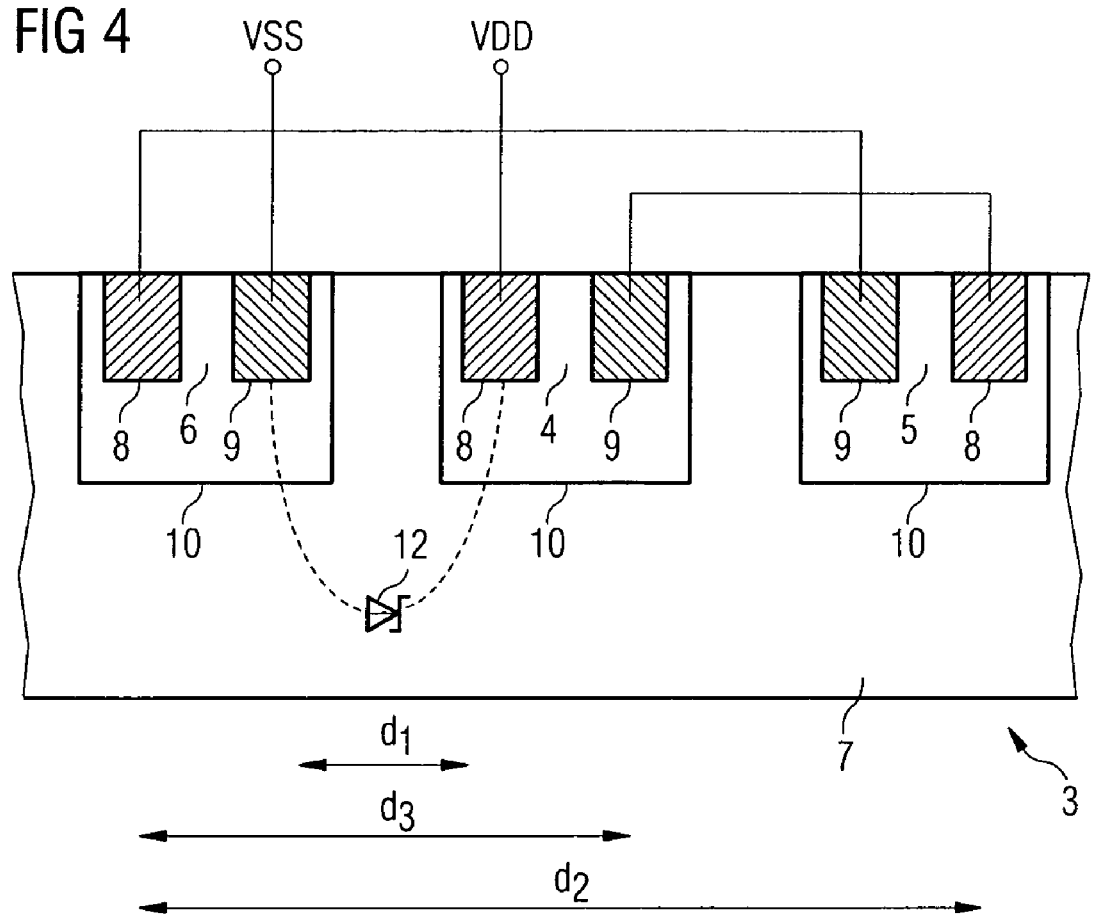
FIG. 4 shows a second exemplary embodiment of the ESD protection device having a diode series circuit.

FIG. 4 shows a second exemplary embodiment of the ESD protection device 3, according to the invention, having a diode series circuit, again for a diode series circuit consisting of N=3 diodes 4-6. Each of the diodes 4-6 is realized as described in the first exemplary embodiment, and the first diode 4 of the series circuit and the third diode 6 of the series circuit are again arranged adjacently on the semiconductor substrate 7. In this case, the anodes 8 and the cathodes 9 of the first diode 4 of the series circuit and of the third diode 6 of the series circuit are arranged in such a way that the spatial distance $d_1$ between the anode 8 of the first diode 4 of the series circuit and the cathode 9 of the third diode 6 of the series circuit is less than a spatial distance $d_3$ between the cathode 9 of the first diode 4 of the series circuit and the anode 8 of the third diode 6 of the series circuit. The spatial distance $d_1$ between the anode 8 of the first diode 4 of the series circuit and the cathode 9 of the third diode 6 of the series circuit, and consequently the time required for the build-up of the parasitic discharge path 12 is thereby further reduced in comparison with the conventional ESD protection device, such that the ESD protection device 3 of the second exemplary embodiment offers further improved protection against transient discharges.

The exemplary embodiments in FIGS. 2 and 4 show the ESD protection device 3, according to embodiments, for a series circuit comprising N=3 diodes. The invention may be applied, however, to ESD protection devices 3 comprising any number N≧2 diodes. In this case, the time required for the build-up of the parasitic discharge path 12 is again reduced, in comparison with the conventional ESD protection device, in that, in the ESD protection device 3 according to embodiments of the invention, the diodes 4-6, 13 are arranged in such a way that the spatial distance $d_1$ between the anode 8 of the first diode 4 of the series circuit and the cathode 9 of the Nth diode 13 of the series circuit is less than in the arrangement of the conventional ESD protection device, in which both the first diode 4 of the series circuit and the Nth diode 13 of the series circuit is a spatially outer diode of the ESD protection device 3, and the spatial distance $d_1$ between the anode 8 of the first diode 4 of the series circuit and the cathode 9 of the Nth diode 13 of the series circuit is equal to the maximum distance $d_2$ between the anode 8 or cathode 9 of a first spatially outer diode of the series circuit and the anode 8 or cathode 9 of a second spatially outer diode of the series circuit. For a given circuit 1 to be protected, in this case the total number N of diodes is expediently so determined that, in the case of a voltage between the first supply potential VDD and the second supply potential VSS, said voltage lying outside, but as close as possible to, a voltage interval within which the voltage fluctuates between the supply potentials VDD, VSS in normal operation of the circuit without damaging the circuit 1 to be protected, the ESD protection device 3 enters a low-resistance state.

Whereas, in the above exemplary embodiments, the first conduction type preferably corresponds to a p-doping and the second conduction type preferably corresponds to an n-doping, the ESD protection device 3 according to the invention may also be realized with the reversed choice of dopings.

In comparison with the conventional ESD protection device, not only does the ESD protection device 3 according to the invention have an improved protection against transient discharges and a comparable or improved clamping characteristic, but it is furthermore neutral in respect of surface area in comparison with the conventional ESD protection device.

In the exemplary embodiments explained above, the parasitic discharge path is self-triggering, owing to the p-doped semiconductor substrate. However, an arrangement, according to an embodiment of the invention, of the diodes of the ESD protection device 3 permits the attainment of an improved clamping characteristic and of an improved time behaviour of the ESD protection device 3 even if the parasitic discharge path 12 is triggered externally, for example, by means of a third supply voltage line.

In the above exemplary embodiments for a diode series circuit having N=3 diodes, the diodes of the series circuit have a one-dimensional spatial arrangement, in which the diodes are arranged in succession along a line. The arrangement, according to embodiments of the invention, of the diodes of the series circuit is not limited thereto, however, but may also be used, for example, for two-dimensional spatial arrangements, in which the diodes of the series circuit are arranged in a plane and are generally no longer arranged in succession along a line. For example, the diodes may be arranged on a rectangular grid. An arrangement, according to an embodiment of the invention, of the diodes in the series circuit, in which a spatial distance between the first and the Nth diode of the series circuit is less than a maximum spatial distance between a pair of diodes of the series circuit, improves both the clamping characteristic and the time behaviour of the ESD protection device 3.

The invention claimed is:

1. ESD protection device for protecting a circuit against electrostatic discharges, the ESD protection device comprising:
a series circuit of N diodes, each diode comprising an anode and a cathode, said series circuit to be connected between a first supply potential and a second supply potential;
the anode of a first diode of the series circuit to be connected to the first supply potential and the cathode of an Nth diode of the series circuit to be connected to the second supply potential; and
wherein the diodes are so arranged that a spatial distance between the anode of the first diode of the series circuit and the cathode of the Nth diode of the series circuit is less than a maximum distance between the anode or cathode of a first spatially outer diode of the series circuit and the anode or cathode of a second spatially outer diode of the series circuit.

2. ESD protection device according to claim 1, wherein for each diode of the N diodes of the series circuit, there are provided an anode zone of a first conduction type and a cathode zone of a second conduction type, opposite to the first conduction type, in a well of the second conduction type, the wells of the second conduction type being laterally arranged in a semiconductor substrate of the first conduction type and adjacent wells of the second conduction type being pairwise spaced apart by a zone of the semiconductor substrate.

3. ESD protection device according to claim 2, wherein the first conduction type is p-doped and the second conduction type is n-doped.

4. ESD protection device according to claim 2, wherein the anode zones or the cathode zones of the diodes of the series circuit are highly doped.

5. ESD protection device according to claim 1, wherein the first diode of the series circuit and the Nth diode of the series circuit are arranged adjacently on the semiconductor substrate.

6. ESD protection device according to claim 1, wherein the N diodes of the series circuit are arranged in a two-dimensional spatial arrangement in which the N diodes of the series circuit are arranged in a predetermined spatial plane, the first spatially outer diode of the series circuit and the second spatially outer diode of the series circuit being determined in that a spatial distance between the first spatially outer diode of the series circuit and the second spatially outer diode of the series circuit is greater than a maximum spatial distance between diodes of any given pair of diodes of the N diodes of series circuit.

7. ESD protection device according to claim 1, wherein the ESD protection device is integrated into a semiconductor circuit for protecting the semiconductor circuit against electrostatic discharges.

8. ESD protection device for protecting a circuit against electrostatic discharges, the ESD protection device comprising:
a series circuit of N diodes, each diode comprising an anode and a cathode, said series circuit to be connected between a first supply potential and a second supply potential;
the anode of a first diode of the series circuit to be connected to the first supply potential and the cathode of an Nth diode of the series circuit to be connected to the second supply potential; and
wherein a spatial distance between the anode of the first diode of the series circuit and the cathode of the Nth diode of the series circuit is less than a spatial distance between the cathode of the first diode of the series circuit and the anode of the Nth diode of the series circuit.

9. ESD protection device according to claim 8, wherein a p-doped anode zone and an n-doped cathode zone is provided in an n-doped well for each diode of the N diodes of the series circuit, the n-doped wells corresponding to different diodes being laterally arranged in a p-doped semiconductor substrate and adjacent n-doped wells being pairwise spaced apart by a zone of the p-doped semiconductor substrate.

10. ESD protection device according to claim 9, wherein the anode zones or the cathode zones of the diodes of the series circuit are highly doped.

11. ESD protection device according to claim 8, wherein the first diode of the series circuit and the Nth diode of the series circuit are arranged adjacently on the semiconductor substrate.

12. ESD protection device according to claim 8, wherein the ESD protection device is integrated into a semiconductor circuit for protecting the semiconductor circuit against electrostatic discharges.

13. ESD protection device for protecting a circuit against electrostatic discharges, the ESD protection device comprising:
a diode stack of N diodes, each diode comprising an anode and a cathode, said diode stack connected between a first supply potential and a second supply potential;
the anode of a first diode of the diode stack connected to the first supply potential and the cathode of an Nth diode of the diode stack connected to the second supply potential; and
wherein at least one of the first diode of the diode stack and the Nth diode of the diode stack is a spatially inner diode of the diode stack.

14. ESD protection device according to claim 13, wherein an anode zone of a first conduction type and a cathode zone of a second conduction type, being opposite to the first conduction type, are provided in a well of the second conduction type for each diode of the diode stack, the wells of the second conduction type being laterally arranged in a semiconductor substrate of the first conduction type and adjacent wells of the second conduction type being pairwise spaced apart by a zone of the semiconductor substrate.

15. ESD protection device according to claim 14, wherein the first conduction type is p-doped and the second conduction type is n-doped.

16. ESD protection device according to claim 13, wherein the spatial distance between the anode of the first diode of the diode stack and the cathode of the Nth diode of the diode stack is less than a spatial distance between the cathode of the first diode of the diode stack and the anode of the Nth diode of the diode stack.

17. ESD protection device according to claim 13, wherein the ESD protection device is integrated into a semiconductor circuit for protecting the semiconductor circuit against electrostatic discharges.

18. ESD protection device for protecting a circuit against electrostatic discharges, the ESD protection device comprising:
a series circuit having plurality of diodes, the plurality of diodes being in electrical series connection, a first diode being connected at a first end of the series circuit and a last diode being connected at a second end of the series circuit, each diode of the plurality of diodes comprising an anode and a cathode, said series circuit to be connected between a first supply potential and a second supply potential;
the anode of the first diode being connected to the first supply potential and the cathode of the last diode being connected to the second supply potential; and
wherein the diodes are so arranged that a spatial distance between the anode of the first diode and the cathode of the last diode is less than a maximum distance between the anode or cathode of a first spatially outer diode of the series circuit and the anode or cathode of a second spatially outer diode of the series circuit.

19. ESD protection device for protecting a circuit against electrostatic discharges, the ESD protection device comprising:
a series circuit having plurality of diodes, the plurality of diodes being in electrical series connection, a first diode being connected at a first end of the series circuit and a last diode being connected at a second end of the series circuit, each diode comprising an anode and a cathode, said series circuit to be connected between a first supply potential and a second supply potential;
the anode of the first diode being connected to the first supply potential and the cathode of the last diode being connected to the second supply potential; and
wherein a spatial distance between the anode of the first diode and the cathode of the last diode is less than a spatial distance between the cathode of the first diode of the series circuit and the anode of the Nth diode of the series circuit.

20. ESD protection device for protecting a circuit against electrostatic discharges, the ESD protection device comprising:
a diode stack having plurality of diodes, the plurality of diodes being in electrical series connection, a first diode being connected at a first end of the diode stack and a last diode being connected at a second end of the diode stack, each diode comprising an anode and a cathode, said diode stack connected between a first supply potential and a second supply potential;
the anode of the first diode being connected to the first supply potential and the cathode of the last diode being connected to the second supply potential; and
wherein at least one of the first diode and the last diode is a spatially inner diode of the diode stack.

* * * * *